United States Patent [19]

Walker, Jr.

[11] Patent Number: 4,626,369

[45] Date of Patent: Dec. 2, 1986

[54] LEAD ZIRCONATE TITANATE CERAMICS

[75] Inventor: Basil E. Walker, Jr., Waldorf, Md.

[73] Assignee: The United States of America as represented by the Secretary of the Navy, Washington, D.C.

[21] Appl. No.: 749,022

[22] Filed: Jun. 26, 1985

[51] Int. Cl.$^4$ .............................................. C04B 35/49
[52] U.S. Cl. .................... 252/62.9; 501/134; 501/135; 501/151; 501/152; 501/153
[58] Field of Search ............... 252/62.9; 501/134, 135, 501/151, 152, 153

[56] References Cited

U.S. PATENT DOCUMENTS

| | | | |
|---|---|---|---|
| 2,911,370 | 11/1959 | Kulcsar | 252/62.9 |
| 2,989,483 | 6/1961 | Miller | 252/62.9 |
| 3,006,857 | 10/1961 | Kulcsar | 252/62.9 |
| 3,021,441 | 2/1962 | Howatt | 310/8 |
| 3,179,594 | 4/1965 | Kulcsar et al. | 252/62.9 |
| 3,549,536 | 12/1970 | Lungo et al. | 252/62.9 |
| 3,684,714 | 8/1972 | Carl et al. | 252/62.9 |
| 3,753,911 | 8/1973 | Walker | 252/62.9 |
| 3,862,046 | 1/1975 | Walker et al. | 252/62.9 |
| 4,152,280 | 5/1979 | Arendt et al. | 252/62.9 |
| 4,152,281 | 5/1979 | Arendt et al. | 252/62.9 |

FOREIGN PATENT DOCUMENTS

| | | | |
|---|---|---|---|
| 47-34918 | 9/1972 | Japan | 252/62.9 |

*Primary Examiner*—Jack Cooper
*Attorney, Agent, or Firm*—Sol Sheinbein; Thomas E. McDonnell

[57] ABSTRACT

Lead zirconate titanate ceramics comprise from about 92 to 99.0 weight percent of lead zirconate and lead titanate in ratio from 0.505 to 0.54:0.495 to 0.46 respectively, from about 0.5 to about 2 weight percent of one or more fluorides or chlorides of an alkali metal or alkaline earth except francium or radium, and 0.5 to 6 weight percent of one or more oxides of magnesium, barium, chromium, scandium, aluminum, lanthanum, praesodymium, neodymium or samarium. The ceramic after pressing is annealed at a temperature from about 1050° to 1350° C. Ceramic elements made from the above ceramics are useful as sonar and microphone transducers.

11 Claims, No Drawings

4,626,369

LEAD ZIRCONATE TITANATE CERAMICS

BACKGROUND OF THE INVENTION

The present invention pertains generally to piezoelectric ceramic compositions and in particular to lead zirconate titanate (PZT) ceramics.

Lead zirconate titanate (PZT) has exceptional dielectric and piezoelectric properties and accordingly is used frequently in electromechanical transducers for producing, sensing, and measuring sound, pressure, vibration, and shock. This ceramic is a polycrystalline solid state solution of lead zirconate ($PbZrO_3$) and lead titanate ($PbTiO_3$). Typically, aggregates of the ceramic are shaped, heat treated, and then poled to form a transducer.

A serious problem associated with PZT transducers is the deterioration in the dielectric constant ($\epsilon_o^{33}$) and piezoelectric response ($d_{33}$) with time, often being referred to as aging. Due to this problem, piezoelectric systems require frequent maintenance and replacement which is expensive and difficult in deep-sea environments.

The PZT composition, like any other ceramic composition, has been frequently modified with the addition of a small amount of one or more other materials, for example oxides or halides. The modifications have been made to improve physical properties, e.g., density, and electrical properties, e.g., the electromechanical coupling factor.

In Kulcsar, U.S. Pat. No. 2,911,370, at least one oxide of the group consisting of niobium, tantalum, and rare earth elements except cerium in an amount from about 0.1 to 5 weight percent on an oxide basis and a carbonate or other compound of calcium and/or strontium in an amount sufficient to impart up to 20 atomic percent of these two alkaline earth elements are added to a PZT composition to improve aging. Kulcsar also discusses the difficulty of improving one property without seriously impairing one or more properties.

Improved aging properties, along with improved combinations of mechanical quality factor, Q, and mechanical coupling, were obtained by the modified PZT ceramics of U.S. Pat. No. 3,179,594 by Kulcsar et al. The general range of $PbZrO_3:PbTiO_2$ mol ratios is from 60:40 to 35:65 wherein from 1 to 10 atomic percent of lead is replaced with magnesium. The lead can be further replaced with 1 to 10 atomic percent of one or more alkaline earth elements selected from the class consisting of barium, strontium, and calcium. The substituents are added as oxides or carbonates.

Oxides and carbonates have been added to PZT ceramics to improve the mechanical quality factor (Q), mechanical coupling, and density. Lead in a PZT ceramic composition is replaced by lanthanum in an amount up to about 8 to 9 atomic percent in U.S. Pat. No. 3,684,714 by Carl et al. for the purpose of improving the density and the electromechanical coupling factors. The lanthanum is added in the form of lanthanum oxide. In U.S. Pat. No. 3,549,536 by Lungo et al., a PZT composition consisting essentially of lead zirconate and lead titanate in a mol ratio from about 65:35 to 40:60 and manganese oxide in an amount from about 0.05 to 0.8 weight percent or consisting essentially of lead zirconate and lead titanate in the above mol-ratio range, of manganese oxide and chromium or iron or uranium oxide, and from 0 to 20 atomic percent of at least one alkaline earth selected from the class consisting of barium, calcium, strontium and magnesium, which is added as a carbonate, are disclosed as having an improved mechanical quality factor (Q). The presence of alumina is shown to decrease the density of PZT ceramics in U.S. Pat. No. 3,856,693 by Kim.

Halides have been added to ceramics to increase density and/or mechanical strength. Density of cured PZT ceramics is increased in U.S. Pat. No. 3,021,441 by G. N. Howatt by the substitution of lead fluoride and/or chloride for up to 70 mole percent of lead oxide. In U.S. Pat. No. 3,753,911 by Walker et al. an alkali fluoride or chloride is added to barium titanate to increase density and mechanical strength of the ceramic. In U.S. Pat. No. 3,862,046 by Walker et al., an alkaline earth halide is added in combination with magnesium or lanthanum oxide to achieve the same objective.

Halides have also been included in ceramics to modify properties other than density. In U.S. Pat. No. 2,989,483 by W. S. Miller, lithium or copper chloride is included in a barium titanate ceramic which becomes polarized without an external magnetic field. The inclusion of sodium and/or potassium chloride is added to an aqueous suspension of the oxides of lead, titanium, and zirconium improves the uniformity of the resulting PZT ceramic in U.S. Pat. Nos. 4,152,280 and 1 by Arendt et al.

SUMMARY OF THE INVENTION

It is, therefore, an object of the present invention to improve the piezoelectric and dielectric properties of PZT ceramics.

A further object of the invention is to decrease aging in PZT ceramics.

These and other objects of the present invention are achieved by modifying PZT composition with the addition of an alkali or alkaline earth halide except bromide or iodide in amount from about 0.5 to 2 weight percent and one or more metal oxides selected from the group consisting of oxides magnesium, chromium, scandium, lanthanum, praseodymium, neodymium, and samarium in an amount from about 0.5 to about 6 weight percent.

DETAILED DESCRIPTION OF THE INVENTION

The lead zirconate titanate (PZT) compositions encompassed by the present invention comprise, based on total composition weight, from about 92 to about 99 weight percent of a solid solution of lead zirconate and lead titanate and from about 1 to 8 weight percent of a modifier. The mol portion of lead zirconate in the solution is from 0.505 to 0.54 and preferably from 0.53 to 0.54. The modifiers comprise one or more fluorides or chlorides of alkali metal and alkaline earth elements except for francium and radium and one or more oxides of magnesium, barium, chromium, scandium, aluminum, lanthanum, praesodymium, neodymium and samarium. Preferably the fluorides and chlorides are of lithium, sodium, magnesium and barium, and preferably the oxides are of magnesium, lanthanum, and chromium. The amount of the oxide, based on total composition, is from about 0.5 to six weight percent with 1 to 4 weight percent preferred, and its amount relative to the halide is from 1:1 to 4:1. The amount of the halide is from 0.5 to 2 weight percent and preferably from 1 to 2 weight percent of total composition.

The results of completed experimental work indicate that the most preferred PZT compositions, based on total composition weight, are: (1) 0.75 to 1.5 weight percent of lithium or barium chloride and fluoride and three to four weight percent of lanthanium oxide, and the remainder of lead zirconate ($PbZrO_3$) and lead titanate ($PbTiO_3$) in the preferred ratio range; (2) 96 to 98 weight percent of $PbZrO_3$ and $PbTiO_3$ in the preferred ratio range, from 0.75 to 1.5 weight of LiF or LiCl or $BaF_2$ or $BaCl_2$ and 1.8 to 2.5 of magnesium oxide (MgO), and the remainder of $PbZrO_3$ and $PbTiO_3$ in the preferred ratio range; (3) from 0.75 to 1.5 weight of LiF, LiCl, $BaF_2$ or $BaCl_2$, from 1.5 to 2.5 weight percent of MgO, and from 3.5 to 4.5 weight percent of $La_2O_3$, and the remainder of $PbZrO_3$ and $PbTiO_3$ in the preferred ratio range; and (4) from 97 to 98.5 weight percent of $PbZrO_3$ and $PbTiO_3$ in the preferred ratio range, from 0.5 to 1.5 weight percent of lithium or barium fluoride or chloride, and from 1.0 to 1.5 weight percent of chromium oxide.

Ceramic bodies of the above compositions are prepared by first mixing the ingredients in the proper proportions to form a uniform mixture. The ingredients have at least four 9's purity and have an average particle size of not more than fifty (50) micrometers and preferably of not more than forty (40) micrometers. If a commercial PZT powder is not used, then PZT powder is prepared by any of the standard methods before adding the modifiers to the PZT powder. The mixture is heated, at rate not in excess of about 650° C. per hour to a temperature from about 950° C. to about 1100° C. and preferably from 1000° C. to 1100° C. for at least ten hours and preferably from 12 to 15 hours. The mixture is allowed to cool to room temperature and is cold-pressed at a pressure from about 9,000 to about 15,000 psi and preferably from 10,000 to 12,000 psi for at least five minutes. The pressed sample is heated at a rate not in excess of 600° C. per hour and preferably from 400° to 500° C. per hour to temperature from about 1050° C. to about 1350° C. and preferably from 1150° C. to 1250° C. for an anneal. The length of the anneal is determined empirically by the quality of the ceramic product. After annealing, the sample is allowed to cool to room temperature.

Instead of cold-pressing the sample, it can be hot-pressed which is the preferred method. A mixture is heated, at rate not in excess of about 650° C. per hour and preferably from 300° to 450° C. per hour, to a temperature from about 850° C. to about 1050° C. and is pressed at pressure of at least about 2000 psi and preferably from 2000 to 3000 psi for at least five minutes and preferably from five to ten minutes. The pressed sample is heated, at rate of not more than about 150° C. per hour and preferably from 75° to 125° C. per hour, to a temperature from about 1050° C. to about 1350° C. and preferably 1150° C. to 1250° C. for at least 12 hours, preferably from 16 to 22 hours and most preferably from 18 to 20 hours to anneal the samples. After annealing, the sample is allowed to cool to room temperature.

A ceramic sample is poled in the usual way. For example, the sample has an electrode attached to two opposite sides, is placed in a light-weight, inert oil, is heated up to 70° to 90° C., and has a potential of about 20 kV/cm placed across it for about ½ hour.

To demonstrate the practice of the present invention the following examples are given. It is understood that these examples are given by way of illustration and are not meant to limit this disclosure or the claims to follow in any manner.

The samples in Table I demonstrate the effect of annealing temperature and the choice of modifier on the piezoelectric constant and the physical strength of the ceramic material. Powder mixtures of this invention with an average particle size from two to twenty micrometers were prepared and mixed in a Spex Mixer to a homogenous mixture. The PZT powder had a 56:44 $PbZrO_3$-$PbTiO_3$ ratio and is designated as PZT in Table I. The weight of the total samples was from 35 to 40 grams and the amount of the modifier is shown in Table I.

The samples were heated to 900° C. at a rate of 400° C. per hour and were pressed into disks at a pressure of 2500 psi for five minutes. Bars with dimensions of 2.54 millimeter by 5.1 millimeter by 25 to 50 millimeter were cut from the pressed disk. The bars were heated to the annealing temperatures of Table I at a rate of 100° C. per hour and were annealed at that temperature for 20 hours. After annealing, the bars were allowed to cool to room temperature.

The bars were poled by attaching to the top and bottom a silver electrode (the electrode separation is thus 2.54 millimeter), placing the bars, in turn, in peanut oil at a temperature from 80° to 95° C., and placing a potential of 20 kV/cm across the bar for about thirty minutes. The modulus of rupture (MOR), the strain piezoelectric constant ($d_{33}$), and the percent of theoretical density (PTD) were determined for the samples. The piezoelectric constant was measured with a Berlincourt Piezo-$d_{33}$ Meter from Channel Products, Inc. The modulus of rupture was determined by the standard strength-of-material method.

TABLE I

| Sample No. | Composition Anneal Temp, °C. | MOR | $d_{33}$ | PTD |
|---|---|---|---|---|
| 1 | PZT | | | |
| | 1000 | 2 MgO 6300 | 80 | 70 |
| | 1100 | 11200 | — | 78 |
| | 1200 | 16700 | 250 | 95 |
| | 1300 | 11600 | 325 | 94 |
| 2 | PZT + wt %/LiF | | | |
| | 1000 | 8900 | 145 | 78 |
| | 1300 | 12500 | 250 | 91 |
| 3 | PZT + 1 wt %/LiF + 2 wt %/MgO | | | |
| | 1000 | 8800 | 26 | 96 |
| | 1300 | 16000 | 150 | 92 |
| 4 | PZT + 1 wt %/LiF + 3 wt %/$Al_2O_3$ | | | |
| | 1000 | 20800 | 18 | 92 |
| | 1300 | 10000 | 220 | 88 |
| 5 | PZT + 1 wt %/LiF + 4 $La_2O_3$ | | | |
| | 1000 | 12000 | 15 | 94 |
| | 1200 | 7300 | 240 | 92 |
| | 1300 | 4700 | 190 | 92 |
| 6 | PZT + 1 LiCl + 4 $La_2O_3$ | | | |
| | 1100 | 12400 | 20 | 95 |
| | 1300 | 10900 | 280 | 93 |
| 7 | PZT + 1 $BaF_2$ + 4 $La_2O_3$ | | | |
| | 1100 | 6500 | 55 | 77 |
| | 1200 | 5800 | 280 | 92 |
| 8 | PZT + 1 LiCl + 2MgO + 4 $La_2O_3$ | | | |

TABLE I-continued

| Sample No. | Composition Anneal Temp, °C. | MOR | $d_{33}$ | PTD |
|---|---|---|---|---|
| | 1200 | 12300 | 124 | 96 |
| | 1300 | 4400 | 160 | 92 |

In addition to the samples reported in Table I, PZT samples containing one weight percent of LiCl or LiBr or LiI. The halide modifiers, with the exception of LiBr, tested almost as well as LiF. The LiBr-modifier sample tested poorly. An addition of two weight percent of MgO had a much higher strain piezoelectric constant than sample 3, but had a lower modulus of rupture which would require additional protection for the ceramic sample from physical forces. A modifier consisting of 2 weight percent of MgO and one weight percent of LiCl or LiBr produced results poorer in every respect than sample 3. When LiCl or LiBr is replaced with one weight percent of magnesium fluoride ($MgF_2$), the strain piezoelectric content of the sample is increased by over 40 percent, but the modulus of rupture is decreased by about a factor of nine.

The results in Table I demonstrate that the sintering temperature must be kept to a certain range if a favorable combination of material strength and piezoelectric response is to be obtained. The composition of the modifier is shown also to be extremely important. Alkali fluorides and certain combinations of metal halides and metal oxides produce PZT ceramics with good initial properties for certain transducer applications. As the next set of samples shows, these PZT ceramics have excellent aging capabilities; so that, in time the PZT ceramics of this invention have substantially better performance than present PZT ceramics.

The samples were prepared in the same way as the previous samples were and the ratio of the basic PZT composition was again 56:44. A Hewlett-Packard Capacitance Bridge was used to measure the capacitance of the bars over 100 days. The dielectric constant was calculated from capacitance by the formula: $\epsilon_o^{33} = Ct/k_oA$ wherein C is the capacitance measurement, t is the thickness of the bar, $k_o$ is the dielectric constant of a vacuum, and A is the surface area of one side of the bar. The coupling coefficient was determined as a measurement of piezoelectric activity.

TABLE II

| Sample No. | Composition | Sintering °C. | $\epsilon_o^{33}$ 1 KHz | % Change | $d_{33}$ | % Change | $K_p$ | % Change |
|---|---|---|---|---|---|---|---|---|
| 1 | PZT | 1200 | 1283 | −3.5 | 252 | −2.9 | — | — |
| 2 | PZT | 1300 | 1077 | −2.4 | 239 | −1.9 | 0.42 | −2.6 |
| 3 | +2Al$_2$O$_3$ | 1300 | 1199 | −2.2 | 71 | −1.5 | 0.17 | −4.9 |
| 4 | +4La$_2$O$_3$ | 1300 | 1520 | — | 230 | — | — | — |
| 5 | +1LiF | 1300 | 1025 | −1.2 | 247 | +6.0 | 0.35 | +1.8 |
| 6 | +1LiI | 1150 | 1122 | −0.4 | 199 | −3.9 | 0.76 | +0.5 |
| 7 | +1LiF/3Al$_2$O$_3$ | 1300 | 688 | −0.8 | 188 | −1.8 | 0.60 | −2.9 |
| 8 | +1LiF/4La$_2$O$_3$ | 1200 | 2085 | −1.7 | 232 | +0.1 | 0.54 | +2.2 |
| 9 | +1LiF/4La$_2$O$_3$ | 1300 | 1369 | −0.6 | 188 | −2.5 | 0.52 | +0.4 |
| 10 | +1LiCl/4La$_2$O$_3$ | 1335 | 1884 | −0.7 | 281 | −2.0 | 0.35 | −3.1 |
| 11 | +1LiCl/2MgO | 1450 | 1252 | −0.0 | 83 | −2.9 | 0.41 | −2.4 |
| 12 | +1LiCl/2MgO | 1150 | 1028 | +6.6 | 122 | +4.3 | 0.46 | +6.4 |
| 13 | +1BaF$_2$/4La$_2$O$_3$ | 1200 | 2612 | −1.1 | 289 | +0.2 | 0.39 | −0.0 |
| 14 | +1MgF$_2$/2MgO | 1300 | 1068 | −5.1 | 215 | −2.2 | 0.67 | −2.6 |

Modifiers consisting of an alkali halide or lanthanium oxide (La$_2$O$_3$) were the best unitary modifiers. The modifier consisting of 0.5 weight percent of chromium oxide gave excellent results. However the combination of a halide and an oxide produced a synergistic effect.

This synergism becomes particularly important with modifiers which already give excellent results, such as LiF or La$_2$O$_3$. Samples 8 and 9 show a marked improvement in properties over either LiF (Sample 5) or La$_2$O$_3$ (Sample 4). The combination of lithium chloride (LiCl) and magnesium oxide (MgO) gives extremely good results. Both of these combinations have properties which improved after one hundred days.

Table III shows the variation of the dielectric constant ($e_o^{33}$) and aging with frequency. The samples were prepared and tested in the same manner as the other samples. In Table III, as before, PZT represents PbZrO$_3$ and PbTiO$_3$ in the respective ratio of 56:44 and samples 2 and 3 have this basic PZT composition plus the indicated modifier. The numeral preceding the chemical formula represents weight percentage of the total ceramic composition. Accordingly, sample 2 comprises 95 weight percent of Pb(Zr$_{0.56}$Ti$_{0.44}$)O$_3$ and five weight percent of the binary modifier.

TABLE III

| Sample No. | Composition | 1 KHz $\epsilon_o^{33}$ | Δ % | 10 KHz $\epsilon_o^{33}$ | Δ % | 100 KHz $\epsilon_o^{33}$ | Δ % | 1 MHz $\epsilon_o^{33}$ | Δ % |
|---|---|---|---|---|---|---|---|---|---|
| 1 | PZT | 1241 | −1.9 | 1229 | −1.9 | 1307 | −2.0 | 594 | −2.7 |
| 2 | +1BaF$_2$ + 4La$_2$O$_3$ | 2188 | −0.5 | 2123 | −0.3 | 2080 | −0.1 | 2113 | −1.6 |
| 3 | +1LiCl + 2MgO + 4La$_2$O$_3$ | 1367 | −2.2 | 1342 | −1.6 | 1322 | −1.3 | 764 | −5.0 |

In Table III, the symbol "Δ%" represents percent change. The percent change in Table III, like that of Table II and the usual manner of representing the amount of aging in piezoelectric ceramics, is a percentage of change per decade or cycle (power of ten) of semilog graph paper.

The results of Table III demonstrate that the improvements provided by modifiers of the present invention are present over a wide range of operating frequencies and the amount of increase over the nonmodified PZT is substantial over the entire range.

The combination of certain one or more halides with certain one or more oxides produces a substantial improvement in dielectric constant and piezoelectric activity with much less aging for PZT ceramics with no modifier or with a halide or an oxide. The best overall combination of properties is also depended on the appealing temperature. Due to the substantially better aging characteristics, ceramics devices would have an extended useful life and better performance over that useful life.

Obviously, many modifications and variations of the present invention are possible in light of the above teachings. It is therefore to be understood that, within the scope of the appended claims, the invention may be practiced otherwise than as specifically described.

What is claimed is:

1. A lead zirconate titanate (PZT) piezoelectric ceramic composition which, based on total composition weight, consists essentially of
    a solid solution of lead zirconate and lead titanate in a $PbZrO_3:PbTiO_3$ ratio from about 0.505:0.495 to about 0.54:0.46;
    a halide salt selected from the group consisting of fluorides and chlorides of alkali metal and alkaline earth elements and mixtures thereof except for francium and radium in an amount from about 0.5 to 2 weight percent; and
    an oxide selected from the group consisting of magnesium, barium, scandium, aluminum, lanthanum, praesodymium, neodymium, samarium, and mixtures thereof in an amount from about 0.5 to about 6 weight percent, the relative amount of oxide being from about 1 to about 4 times that of said halide.

2. The PZT ceramic composition of claim 1 wherein said halide is selected from the group consisting of fluorides and chlorides of lithium, sodium, magnesium, barium and mixtures thereof and said oxide is selected from the group consisting of magnesium, lanthanum, and mixtures thereof.

3. The PZT ceramic composition of claim 2 wherein said ratio of lead zirconate to lead titanate is from 0.53:0.47 to 0.54:0.46.

4. The PZT ceramic composition of claim 3, wherein:
    said halide is selected from the group consisting of lithium or barium fluoride, lithium or barium chloride, and mixtures thereof and is in an amount from 0.75 to 1.5 weight percent;
    said oxide is lanthanum oxide in an amount from 3 to 4 weight percent; and
    the remainder of said PZT ceramic composition is said solid solution of lead zirconate and lead titanate.

5. The PZT ceramic composition of claim 4 wherein said halide is lithium fluoride in an amount of 1 weight percent and said oxide is lanthanum oxide in an amount of 4 weight percent.

6. The PZT ceramic composition of claim 4 wherein said halide is barium fluoride and said oxide is lanthanum oxide in an amount of 4 weight percent.

7. The PZT ceramic composition of claim 3 wherein:
    said halide is selected from the group consisting of lithium or barium fluoride, lithium or barium chloride, and mixtures thereof and is in an amount from 0.75 to 1.5 weight percent;
    said oxide is magnesium oxide and is in an amount from 1.8 to 2.5 weight percent; and
    the remainder of said PZT ceramic composition is said solid solution of lead zirconate and lead titanate.

8. The PZT ceramic composition of claim 7 wherein said halide is lithium chloride in an amount of 1 weight percent and said oxide is magnesium oxide in an amount of 2 weight percent.

9. The PZT ceramic composition of claim 3 wherein:
    said halide is selected from the group from lithium fluoride or chloride, barium fluoride or chloride, and mixtures thereof;
    said oxide is a mixture of magnesium oxide in an amount from 1.5 to 2.5 weight percent and lanthanum oxide in an amount from 3.5 to 4.5 weight percent; and
    the remainder of said PZT ceramic composition is said solid solution of lead zirconate and lead titanate.

10. The PZT ceramic composition of claim 2 wherein said halide is in an amount from 1 to 2 weight percent and said oxide is an amount from 1 to 4 weight percent.

11. The PZT ceramic composition of claim 10 wherein said ratio of lead zirconate to lead titanate is from 0.53:0.47 to 0.54:0.46.

* * * * *